US005293071A

United States Patent [19]
Erdos

[11] Patent Number: 5,293,071
[45] Date of Patent: Mar. 8, 1994

[54] BUMP STRUCTURE FOR BONDING TO A SEMI-CONDUCTOR DEVICE

[75] Inventor: George Erdos, Toronto, Canada

[73] Assignee: Gennum Corporation, Burlington, Canada

[21] Appl. No.: 836,580

[22] Filed: Feb. 18, 1992

[51] Int. Cl.[5] .................... H01L 29/440; H01L 29/460
[52] U.S. Cl. ...................................... 257/737; 257/751
[58] Field of Search ............... 257/737, 750, 751, 763, 257/764

[56] References Cited

U.S. PATENT DOCUMENTS

| 3,689,991 | 9/1972 | Aird | 29/577 |
| 4,263,606 | 4/1981 | Yorikane | 257/737 |

FOREIGN PATENT DOCUMENTS

| 0094641 | 4/1989 | Japan | 257/737 |
| 0033929 | 2/1990 | Japan | 257/737 |

OTHER PUBLICATIONS

*Failure Mechanisms in Tab Inner Lead Bonding and the Relationship Between Design and Reliability,* James D. Hayward, (1991) IEEE/CHMT 91 Symposium, pp. 6–9.

*Quality and Reliability of Tab Inner Lead Bond,* P. Hedemalm, (1991), ITAB 90 Proceedings, pp. 87–102.

*Primary Examiner*—Rolf Hille
*Assistant Examiner*—Peter Toby Brown
*Attorney, Agent, or Firm*—Bereskin & Parr

[57] ABSTRACT

A bump structure for bonding leads to a semi-conductor, in which the bump has a thin lower portion which overlaps and seals the edges of the passivation layer, and a thicker upper or stem portion of smaller lateral dimensions to fit within the margins of the opening in the passivation layer. Thus, during bonding, downward compressive forces are applied primarily through the bump stem directly to the metal termination pad beneath the bump, and very little force is applied to the edges of the passivation layer. This reduces the likelihood of passivation layer cracking, increasing device reliability. Because the bump stem is formed within the margins of the passivation layer opening, it has a flat top, resulting in better lead bonding.

5 Claims, 1 Drawing Sheet

BUMP STRUCTURE FOR BONDING TO A SEMI-CONDUCTOR DEVICE

FIELD OF THE INVENTION

This invention relates to an improved bump structure and to a method of making the same, for thermocompression or other bonding of leads to a semi-conductor device.

BACKGROUND OF THE INVENTION

Bonding of leads to integrated circuits has been known since prior to 1972, when U.S. Pat. No. 3,689,991 entitled "Method of Manufacturing a Semi-Conductor Device Utilizing a Flexible Carrier" was issued. This patent deals with tape automated bonding, in which sets of leads carried by a tape are bonded by the application of heat and pressure to small raised "bumps" on the semi-conductor devices. Typically both the leads and the bumps formed on the circuits are made of gold, solder, copper, or other metal or alloy.

A persistent problem with typical bonding of leads to bumps is that since high temperatures and considerable pressures are usually used to form a sound joint, the process tends to create cracks in the layers under the bump. The cracks permit air and moisture to reach the very thin underlying aluminum metallization layer over which the bumps are formed. These layers then oxidize and effectively disappear, allowing the bump to lift off the device and destroying the utility of the device.

The above problem has been known for some time, and various attempts have been made to alleviate it. For example, in a paper entitled "Failure Mechanisms in Tab Inner Lead Bonding and the Relationship Between Design and Reliability" by James D. Hayward, published in IEEE/CHMT '91 IEMT Symposium, page 6, the reliability problems were discussed, and it was suggested that reduction in cracking could be achieved by various design approaches. It was noted that the degree of cracking correlated with the degree of passivation overlap but that neither a reduction in passivation overlap nor a change to make the passivation layer less brittle completely solved the problem. It was suggested that a reduction in the degree of overlap and the use of less brittle passivation layers, as well as the use of appropriate organic die coatings for further sealing, would improve mechanical integrity and reliability. However, it is found that these approaches do not in fact solve the problem.

BRIEF SUMMARY OF THE INVENTION

Accordingly, in one of its aspects, the invention provides, in an integrated semi-conductor device having a surface and a conductive termination pad on said surface, and a protective passivation layer covering said surface and overlapping the edges of said pad, said passivation layer having an opening therein of dimensions less than the dimensions of said pad to expose a portion of said pad through said opening, an improved bump structure for connection of a lead to said circuit, said bump structure comprising a lower bump portion of dimensions greater than the dimensions of said opening, said lower bump portion being located over said opening and extending beyond the edges of said opening to cooperate with said passivation layer to seal said pad, and an upper bump portion having a stem of dimensions less than those of said opening, said stem being located over said first bump portion and over said opening with the margins of said stem within those of said opening, so that when a lead is compressed downwardly onto said upper bump portion the compressive forces transmitted through said stem will be primarily applied directly to said pad and will not tend to crack said protective layer.

In another aspect, the invention provides a method for forming a bump structure on an integrated semi-conductor device of the kind having a surface, a conductive termination pad on said surface, and a protective passivation layer covering said surface and overlapping the edges of said pad, said passivation layer having an opening therein of dimensions less than the dimensions of said pad to expose a portion of said pad through said opening, said method comprising depositing a thin layer of conductive metal over said opening and overlapping the edges of said opening to form a lower bump portion, and then depositing a substantially thicker layer of metal over said lower bump portion to form an upper bump portion of dimensions less than those of said opening with said upper bump portion located over said opening and within the margins of said opening.

Further objects and advantages of the invention will appear from the following description, taken together with the accompanying drawings.

DETAILED DESCRIPTION OF PREFERRED EMBODIMENT

Figure 1:
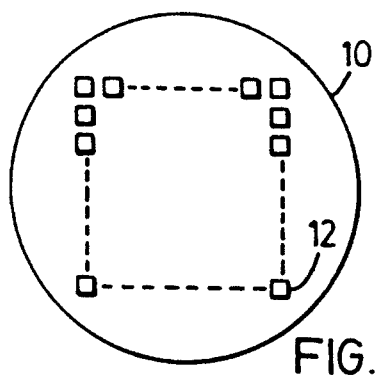
FIG. 1 is a plan view of a prior art assembly of integrated circuits, before being sawn into individual circuits.

Reference is first made to FIG. 1, which shows at 10 a silicon semi-conductor wafer 10 containing a large number of integrated circuits 12. (Wafer 10 may be 75 to 100 mm in diameter). Each of the circuits 12 contains a number of circuit termination points (not shown in FIG. 1) to which leads must be attached.

Figure 2:
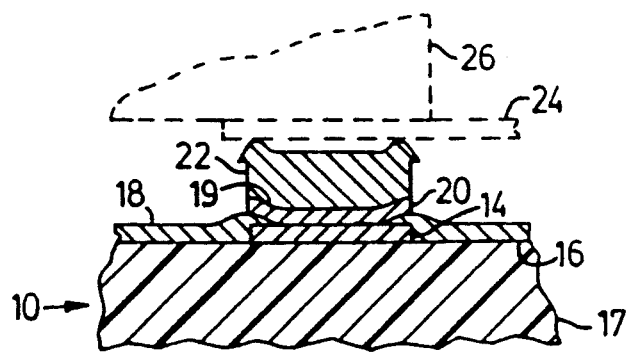
FIG. 2 is a sectional view of a typical prior art bump structure.

As shown in FIG. 2 (which is prior art), lead attachment points are formed by thin aluminum pads 14 on the surface 16 of the silicon dioxide substrate 17 of the wafer 10. After the thin pads 14 are deposited on surface 16, the entire surface of the circuit (except for pads 14) is covered with a thin passivation layer 18, typically of glass or ceramic material, to protect the circuit and to act as an insulator. The passivation layer 18 overlaps the edges of the aluminum pads 14, leaving openings 19 which expose the aluminum pads 14. The openings 19 are always of dimensions smaller than those of pads 14, to seal the edges of pads 14. (The term "dimensions" refers to lateral dimensions.)

Next, a barrier layer 20 of titanium tungsten (TiW) is applied over the aluminum pads 14, and then a gold bump 22 (other suitable metals and alloys can also be used) is electroplated over the barrier layer 20. The stem of the gold bump 22 is wide enough to overlap the edges of the passivation layer 18, i.e. the stem of the gold bump 22 has dimensions which are at least as large as those of the aluminum pad 14. This ensures that the aluminum pad 14 is completely sealed. Typically the bump 22 is square in plan view and is about 100 microns wide on each side.

The difficulty with the FIG. 2 structure, as mentioned is that when a lead (indicated in dotted lines at 24) is compressed on to the bump 22 by a heated bonding tip 26 (also shown in dotted lines), the compression forces transmitted through the stem of the bump 22 tend to crack the passivation layer 18. This allows moisture and oxygen to reach the aluminum layer 14, causing the aluminum to oxidize and disappear.

Figure 3:
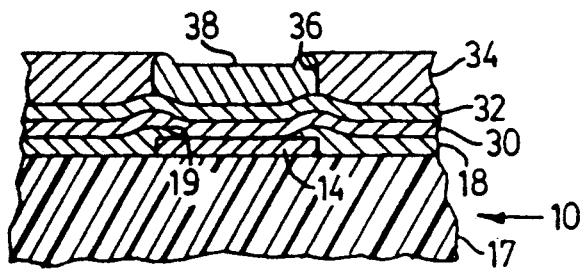
FIG. 3 is a sectional view of a bump structure according to the invention, part way through the process of being manufactured.

Reference is next made to FIG. 3 which illustrates the first stages of a process for making a bump which has a reduced tendency to cause cracking during thermocompression bonding. In this process, the wafer 10, after the passivation layer 18 has been applied leaving the aluminum pads 14 partly exposed, is placed in a chamber where the surfaces of the exposed pads 14 are bombarded with energetic particles from a plasma to remove a very thin (submicron) oxide layer from the aluminum. Then, a very thin layer 30 (typically 1,500 angstroms) of barrier material (TiW) is sputtered on to the entire surface of the wafer. This is conventional.

Next, in the same chamber, a further thin layer 32 of gold (typically 1,500 angstroms) is sputtered onto the layer 30 to prevent the layer 30 from oxidizing. Layer 32 also covers the entire wafer. Again, this is conventional.

The wafer 10 is next coated with a photo-resist layer 34 and is then masked and exposed to light. Only the areas over the pads 14 are exposed. The exposed photo-resist is then washed away, leaving openings 36 which are of the same dimensions as the pads 14 and are located over the pads 14, aligned with the pads 14. This is conventional.

Next, the wafer is placed in a gold solution, and gold is electroplated into the openings 36, forming a layer 38 of gold. In the past, the layer 38 would have been built up to about 25 microns in thickness, forming the bump 22. (One micron = $10^{-6}$ meters = 10,000 angstroms.) However in the present process, the layer 38 is very thin, although it is thicker than the sputtered layer 32. Typically the layer 38 is about three times as thick as the sputtered layer 32, i.e. it is typically about 4,500 angstroms thick. As will be seen, a portion of layer 38 will form the lower portion of the final gold bump.

Figure 4:
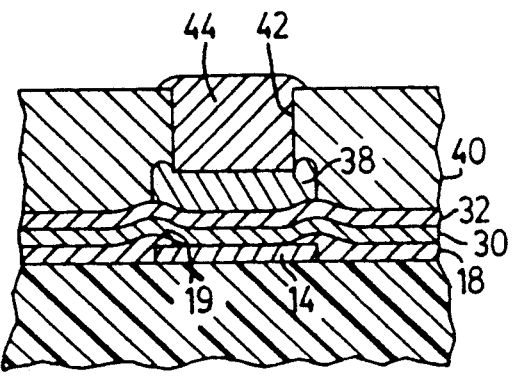
FIG. 4 is a sectional view of the bump structure of FIG. 3, but taken further in the process of manufacture.

Next, the photo-resist layer 34 is removed, leaving the thin layer 32 of gold covering the entire wafer, and also leaving partly formed bumps 38. Then, as shown in FIG. 4, a new photo-resist layer 40 is applied, masked, exposed to light, and the exposed portions are removed, leaving openings 42 in the remaining photo-resist layer 40. Each opening 42 is centered over the opening 19 in the passivation layer 18 and is of dimensions equal to or slightly smaller than those of opening 19. Thus, the margins of opening 42 are entirely within the margins of opening 19.

Next, the wafer is again electroplated with gold, to build an upper gold bump portion 44 typically 25 microns in thickness.

After the upper gold bump stem portion 44 has been formed, the resist layer 40 is removed, and then the entire layer 32 of gold overlying the wafer is etched away. This is accomplished by etching away about 1500 angstroms of gold. The etching also reduces the thickness of the exposed margins of bump lower portion 38 from 4,500 angstroms to 3,000 angstroms, and reduces the height of the upper gold bump stem portion 44 by 1,500 angstroms.

Figure 5:
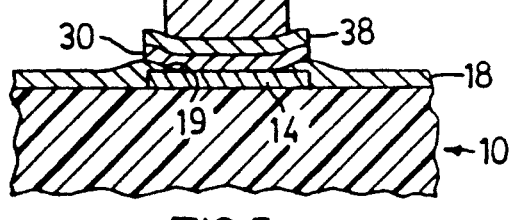
FIG. 5 is a sectional view of a completed bump structure according to the invention.

Next, the barrier layer 30 of TiW (except as shown for that part covered by bump lower portion 38) is etched away (the etchant for TiW does not attack gold), leaving a final bump 50 as shown in FIG. 5. As shown, bump 50 has the upper or stem portion 44 which overlies opening 19 in the passivation layer 18 and does not overlap the passivation layer. In other words, the margins of stem 44 are entirely within those of opening 19. The bump 50 may have a top cap 52 which has larger dimensions (resulting from the electroplating overflowing the photo-resist layer) but the cap 52 does not create a problem, for the reasons to be described. Also, because stem 44 is entirely within the margins of opening 19, and since the topography of each layer tends to follow that of the layer beneath it, the top 53 of cap 52 is essentially flat.

Bump 50 also has a lower and very thin portion 38 which overlaps the passivation layer 18 to ensure that the aluminum pad 14 is properly sealed.

When a lead is bonded to bump 50, the downward compressive forces will be applied through stem 44 directly to the aluminum pad 14. Because the margins of stem 44 are within those of opening 19, very little compressive force is applied to the overlapped edges of the passivation layer 18. While some force is applied to the overlapped edges of the passivation layer because of the presence of lower bump portion 38 and barrier layer 20, these layers are very thin and transmit little force. The force transmitted by the margins of lower bump portion 38 is also small because gold is soft and has low shear strength. The margins of bump portion 38 may range between 1,000 and 10,000 angstroms in thickness, but preferably they should be as thin as possible to transmit as little force as possible.

Thus, it will be seen that since little force is transmitted to the passivation layer 18, therefore the likelihood of cracking is greatly reduced. The main compressive forces are applied directly to the aluminum pad 14 which is better able to withstand these forces. At the same time, the overlap of the passivation layer 18 provided by the lower bump portion 38 ensures that the passivation layer 18 is adequately sealed.

In addition, since top 53 is now flat, the lead 24 will now be more likely to bond to the entire top surface of the bump, rather than only to the raised edges of the bump top surface, as had previously been the case.

While a preferred method has been described for forming the bump 50, it will be appreciated that other methods can been used, so long as they result in a bump having an upper portion or stem which does not overlap the passivation layer, and a lower very thin portion which overlaps the passivation layer to seal it but does not transmit substantial forces to the passivation layer.

Figure 6:
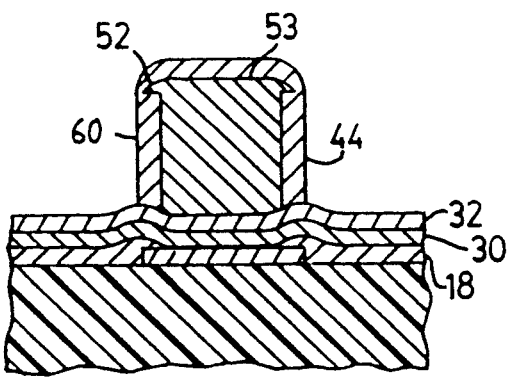
FIG. 6 is a sectional view of another partly completed bump structure according to the invention.
Figure 7:
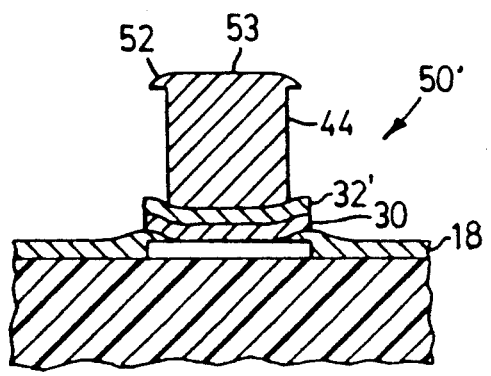
FIG. 7 is a sectional view of the bump structure of FIG. 6 after completion.

For example, instead of the method described, the upper bump stem portion 44 can be formed directly over opening 19, on gold layer 32, as shown in FIG. 6. The margins of bump stem portion 44 will, as before, be within the margins of opening 19. Then, before gold layer 32 is etched away, its margins out to the edges of the aluminum pad 14 (and also the upper bump stem portion 44) are masked by a small area of photo-resist as shown at 60 in FIG. 6. The gold layer 32 is then etched away, leaving a remnant or skirt 32' (FIG. 7) which forms the lower portion of the bump 50' and seals the opening 19. A difficulty with this second method is that it requires very accurate tolerances which can be difficult to achieve.

As mentioned, any suitable materials can be used, eg. solder or copper, or other metals or alloys.

I claim:

1. In an integrated semi-conductor device having a surface and a laterally extending conductive termination pad on said surface, and a protective passivation layer covering said surface and overlapping the edges of said pad, said passivation layer having an opening therein having edges, said opening being of lateral dimensions between said edges of said opening which are less than the lateral dimensions of said pad to expose a portion of said pad through said opening, an improved bump structure extending vertically above said pad for connection of a lead to said device, said bump structure comprising a lower bump portion having a lower layer of a barrier material, said lower bump portion further having an upper layer of a soft conductive material different from said barrier material and overlying said lower layer, said soft conductive material being gold, said upper layer entirely covering said lower layer and said lower layer having lateral dimensions greater than the lateral dimensions of said opening, said lower bump portion being located over said opening and having side margins extending laterally beyond the edges of said opening to cooperate with said passivation layer to seal said pad, and an upper bump portion having a top and a stem of a soft conductive material different from said barrier material, said stem having side margins and being of lateral dimensions less than those of said opening, said stem being located over said lower bump portion and over said opening with said side margins of said stem being entirely within said edges of said opening, said stem being of vertical thickness greater than the vertical thickness of said lower bump portion, said lead being thermo-compression bonded onto said top of said upper bump portion, the vertical thickness of said lower layer in said side margins of said lower bump portion which extend laterally beyond said side margins of said stem being between 1,000 Angstroms and 10,000 Angstroms, there being no intervening layer between said upper layer of said lower bump portion and said stem, so that when said lead is compressed downwardly onto said top of said upper bump portion the compressive forces transmitted through said stem will be primarily applied directly through said lower bump portion to the portion of said pad immediately below said stem and will not tend to crack said passivation layer, and said side margins of said lower bump portion form a protective sealing skirt extending laterally beyond said edges of said opening to seal said pad.

2. A device according to claim 1 wherein said side margins of said upper layer of said lower bump portion extending beyond said side margins of said stem are 3,000 angstroms in vertical thickness.

3. A device according to claim 1 wherein said upper bump portion is at least several microns in vertical thickness.

4. A device according to claim 3 wherein said upper bump portion is 25 microns in vertical thickness.

5. A device according to claim 1 wherein said upper layer of said lower bump portion and said stem of said upper bump portion are both of the same material.

* * * * *